United States Patent [19]

Castro

[11] Patent Number: 5,039,941
[45] Date of Patent: Aug. 13, 1991

[54] VOLTAGE THRESHOLD MEASURING CIRCUIT

[75] Inventor: Hernan A. Castro, Shingle Springs, Calif.

[73] Assignee: Intel Corporation, Santa Clara, Calif.

[21] Appl. No.: 559,361

[22] Filed: Jul. 27, 1990

[51] Int. Cl.[5] ............................................. G01R 31/26
[52] U.S. Cl. ............................. 324/158 T; 324/158 D
[58] Field of Search ........... 324/158 T, 158 R, 158 D; 307/201, 464; 364/513; 330/2

[56] References Cited

U.S. PATENT DOCUMENTS

| | | | |
|---|---|---|---|
| 3,648,170 | 3/1972 | Embree et al. | 324/158 T |
| 4,382,229 | 5/1983 | Cottrell et al. | 324/158 T |
| 4,904,881 | 2/1990 | Castro | 307/201 |

Primary Examiner—Ernest F. Karslen
Attorney, Agent, or Firm—Blakely, Sokoloff, Taylor & Zafman

[57] ABSTRACT

A circuit for determining the voltage threshold of a field-effect device is described. The invention includes an amplifier means which produces an output voltage directly proportional to the current flowing within the device-under-test. A circuit means is utilized for receiving the output voltage from the amplifier means and for generating a feedback voltage at the gate of the field-effect device. This feedback voltage is dynamically limited by an RC time constant such that the feedback voltage rapidly settles to the voltage threshold of the field-effect device.

21 Claims, 2 Drawing Sheets

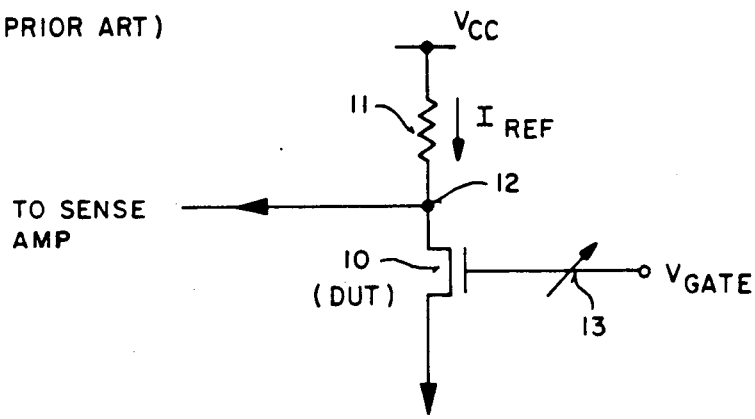
FIG_1 (PRIOR ART)
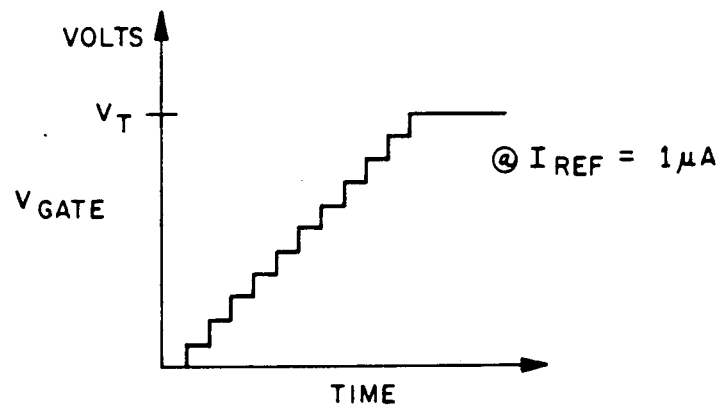
FIG_2 (PRIOR ART)
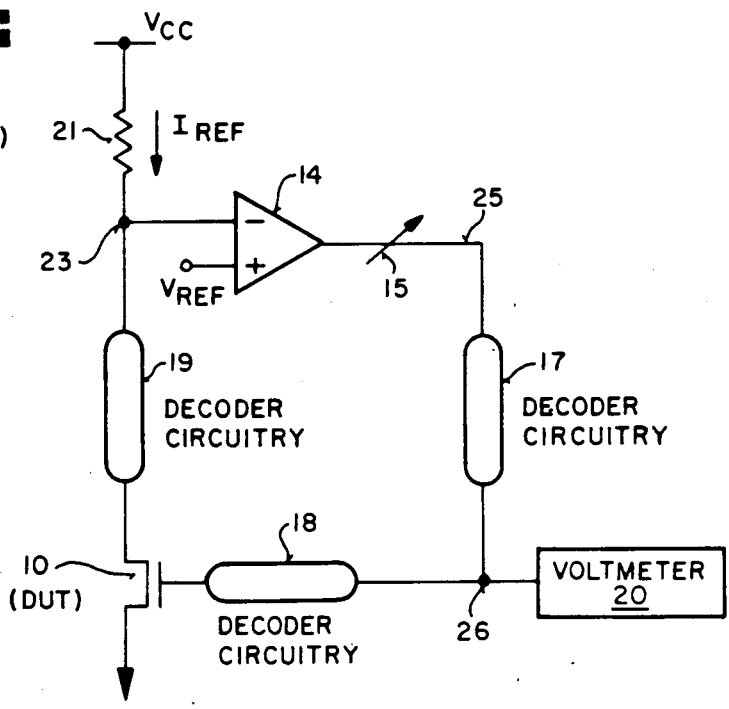
FIG_3 (PRIOR ART)

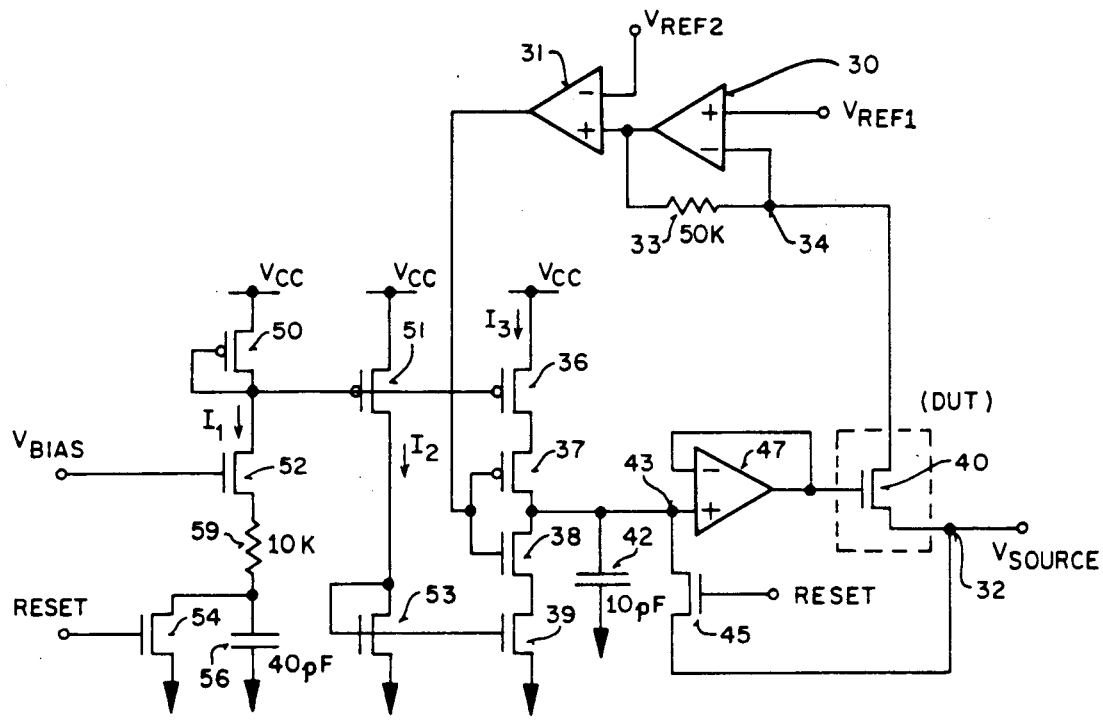
FIG_4
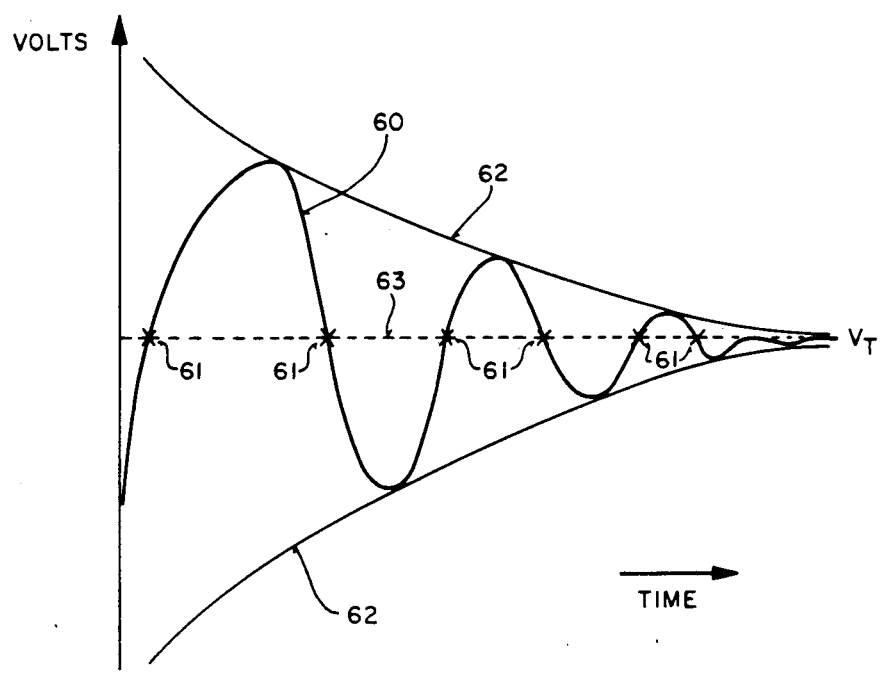
FIG_5

5,039,941

VOLTAGE THRESHOLD MEASURING CIRCUIT

FIELD OF THE INVENTION

The present invention relates to the field of measurement circuits; particularly those circuits utilized for the measurement of the threshold voltage of a field-effect transistor (FET) fabricated as part of an integrated circuit.

BACKGROUND OF THE INVENTION

In integrated circuits which utilize field-effect transistors, it is often desirable to accurately determine the voltage threshold ($V_T$) of the individual devices. For example, neural networks typically require frequent measurement of FET voltage thresholds as part of the learning or training process. A great deal of time is routinely spent in measuring the voltage threshold of these devices in order to properly set synapse weights on floating gate devices to obtain a rapidly converging response for the network. At present, there is no way to quickly obtain an accurate and precise measurement of the $V_T$ of each of the various floating gate transistors within a neural network array.

The traditional method of measuring $V_T$ involves gradually ramping the gate voltage of the device-under-test (DUT) while simultaneously monitoring the current flow through the channel of the device. The voltage threshold is arbitrarily defined as the gate to source voltage at which a predetermined current flows across the channel region. Usually, the voltage threshold is defined as the gate voltage which produces approximately one microampere of current flow between the source and drain regions. Once this predetermined current is reached (e.g., about 1 $\mu A$), ramping of the gate voltage is halted and the threshold voltage is recorded.

Depending on the resolution required, the ramping method normally takes an inordinate amount of test time due to the small increments or steps in voltage which are required. Performing a binary search helps to reduce the number of testing points. But binary searching typically requires the use of expensive digital to analog (D/A) converters which transform the digital binary sequence into a gate voltage. Moreover, D/A converters have their own speed-limitations so that the overall reduction in test time using the binary method is not overly significant. D/A converters take up a lot of silicon area and are difficult to integrate with other circuitry.

Other past approaches include attempts to automate the testing process utilizing an operational amplifier coupled to the DUT through a feedback network. The main problem associated with this technique is the fact that the feedback loop often includes a path through the decoding circuitry of the semiconductor memory array. Because the decoding circuits have their own associated resistances and capacitances, these types of automated circuits exhibit a tendency to oscillate unless the response (e.g., gain) of the operational amplifier is weakened considerably. Slowing of the operational amplifier's response, of course, slows down the entire testing procedure. The effect of a weakened response is usually dramatic enough that most automated circuits perform no better than conventional linear or step ramp approaches.

Thus, there exists an unrequired need for a circuit capable of obtaining rapid voltage threshold measurements on field-effect devices fabricated in an integrated circuit. The present invention provides a circuit which can make fast and accurate threshold voltage measurements on semiconductor FET devices. The invention is ideally suited for use in measuring the $V_T$ of devices formed as part of a large array in an integrated circuit. In addition, the invented circuit can be easily fabricated as an integral part of the semiconductor circuit which contains the transistors to be tested. This obviates the need for an external ramp generator binary sequence generator, or other external measurement equipment.

SUMMARY OF THE INVENTION

A circuit for determining the voltage threshold of a field-effect device (such as an EPROM or EEPROM) is described. The field-effect device is characterized as having a pair of space-apart regions of a first conductivity type formed in a semiconductor substrate of a second conductivity type. The field-effect device includes a gate which controls the conductivity between the spaced-apart regions. Very often, such a device is fabricated as part of a larger semiconductor memory array.

In one embodiment, the present invention includes amplifier means for causing a current to flow through the field-effect device. The amplifier means also produces an output voltage which is directly proportional to the current flowing within the device. A circuit means is utilized for receiving the output voltage from the amplifier means and for generating a feedback voltage at the gate of the field-effect device. This feedback voltage is dynamically limited by an RC time constant such that the feedback voltage rapidly settles to the voltage threshold of the field-effect device. The RC transient is produced within the circuit means.

To be more specific, the circuit means comprises a switching circuit means for producing the feedback voltage in response to the output voltage of the amplifier means. The amplitude of this feedback voltage is dependent on the current flowing through the switching circuit means. Also included within the circuit means is a current mirror having a resistor and a capacitor for developing the RC transient. The current mirror dynamically limits the magnitude of the current flowing in the switching circuit means according to the RC transient. At the same time the switching circuit means reverses the direction of the current flow according to the output voltage of the amplifier means.

BRIEF DESCRIPTION OF THE DRAWINGS

FIG. 1 is a simplified schematic drawing of a typical prior art threshold measuring circuit.

FIG. 2 is a voltage versus time plot of the gate voltage applied to the device-under-test according to the prior art measurement scheme of FIG. 1.

FIG. 3 is a circuit schematic of a prior art automated threshold measurement circuit employing operational amplifier feedback.

FIG. 4 is a circuit schematic of the currently preferred embodiment of the present invention.

FIG. 5 illustrates how the circuit of FIG. 4 rapidly converges to automatically measure the threshold voltage of a MOSFET device.

DETAILED DESCRIPTION OF THE PREFERRED EMBODIMENT(S)

A voltage threshold measuring circuit for measuring the threshold voltage of field-effect transistors in an integrated circuit is described. The invented circuit is particularly well-suited for applications in which the field-effect transistors to be tested are accessed through decoding circuitry associated with a larger array, e.g., a large scale memory circuit such as an EPROM, EEPROM, flash EEPROM, etc.

In the following description, numerous specific details are set forth such as voltages, currents, device types, etc., in order to provide a thorough understanding of the present invention. It will be obvious, however, to one skilled in the art that these details are not required to practice the present invention. In other instances, well-known circuits, methods and the like are not set forth in detail in order to avoid unnecessarily obscuring the present invention.

I. Discussion of the Prior Art

Before describing the present invention in detail, an understanding of basic prior art measurement schemes will aid in appreciation of the details to follow.

FIG. 1 illustrates a fundamental measurement technique characteristic of the prior art. In FIG. 1, DUT 10 has its drain coupled to node 12, its source grounded, and its gate coupled along line 13 to an external voltage generator. The external voltage generator produces a ramp voltage, $V_{GATE}$, which varies as a function of time. Resistor 11 is coupled between node 12 and the supply potential (e.g., $V_{CC}$ for the case in which transistor 10 comprises an n-channel field-effect device).

During testing, the gate voltage is successively ramped or stepped as indicated by arrow 13 in FIG. 1. By way of example, a plot of $V_{GATE}$ over time is provided in FIG. 2. Naturally, raising the gate potential causes a current, $I_{REF}$, to flow through resistor 11 and DUT 10. For each incremental value of $V_{GATE}$, the voltage drop produced across resistor 11 is measured at node 12 by a sense amplifier means (e.g., a comparator). This process of successively incrementing the gate voltage continues until an arbitrarily defined reference current is reached. This is conventionally defined at $I_{REF} = 1$ $\mu A$. When $I_{REF}$ equals the reference current the voltage drop at node 12 becomes sufficiently large so as to trigger the sense amplifier means. Triggering of the sense amplifier stops the ramping cycle. The gate voltage, $V_{GATE}$, which represents the $V_T$ of DUT 10, is then recorded.

FIG. 3 illustrates a different prior art method for automatic measurement of the voltage threshold of a MOSFET device. The circuit of FIG. 3 includes an operational amplifier (e.g., op amp) 14 connected in a feedback loop with a field-effect device (DUT) 10. As previously mentioned, since DUT 10 is usually fabricated as part of a larger semiconductor array, the measurement feedback path includes various decoder circuitry. Of course, this decoder circuitry, has associated resistance/capacitance (e.g., RC) characteristics, which are shown in FIG. 3 by elements 17, 18 and 19. The presence of elements 17-19 in the feedback path creates certain problems as will be discussed shortly.

The output of operational amplifier 14 is provided on line 25 which is coupled to the gate of DUT 10. One input of amplifier 14 is coupled to a voltage reference while the other input is coupled to node 23 of the circuit. Node 23 is coupled to both the drain of DUT 10 and to one side of resistor 21—the other side of resistor 21 being coupled directly to $V_{CC}$. The values of resistor 21 and voltage $V_{REF}$ are chosen such that the voltage drop across resistor 21 produces a voltage at node 23 which matches the reference voltage, $V_{REF}$, when $I_{REF}$ (i.e., the current flowing through resistor 21) equals one microampere.

When the circuit of FIG. 3 is initially coupled to DUT 10, amplifier 14 begins ramping the voltage present on line 25 in an attempt to drive the voltage at node 23 to $V_{REF}$. This is shown by arrow 15 in FIG. 3. When the voltage at node 23 equals the reference voltage $V_{REF}$, ramping is halted and the potentials around the feedback loop are allowed to stabilize. The voltage threshold of DUT 10 is then measured using an ordinary voltmeter 20 connected to node 26.

Of course, decoder circuit elements 17-19 tend to produce oscillations in the feedback loop of FIG. 3, due to the RC transients present in the loop path. Obviously, oscillations are undesirable since an accurate $V_T$ measurement requires stable potentials around the loop path. To avoid producing oscillations, the gain of amplifier 14 must be drastically reduced. Slowing the response of op amp 14 leads to a corresponding increase in test time. The end result is that the circuit of FIG. 3, by and large, is characterized by long settling time due to the reduced gain of amplifier 14. Thus, what is needed is a way of speeding up the measurement process by maintaining high loop gain while dynamically limiting any oscillations which might occur.

II. Discussion of the Present Invention

The currently preferred embodiment of the present invention is illustrated in FIG. 4. In FIG. 4, DUT 40 is shown having its drain coupled to node 34, its gate coupled to the output of amplifier 47 and its source coupled to node 32, labeled $V_{SOURCE}$. Coupling of node 32 to an external pin is an optional improvement in the embodiment of FIG. 4. Normally, node 32 is grounded. However, since the threshold voltage of DUT 40 can sometimes be negative, having an external pin available allows the source of DUT 40 to be biased at a positive voltage level (e.g., 2 Volts). This permits measurement of negative voltage thresholds. Where the $V_T$ of DUT 40 is always positive, node 32 can remain grounded.

Effectively, on the drain side of DUT 40, there is a sensor comprising operational amplifier 30 and feedback resistor 33 coupled at node 34. The negative input of amplifier 30 is coupled to node 34 while the positive input is coupled to a voltage reference, $V_{REF2}$. Resistor 33, which in the currently preferred embodiment is 50K ohms, is connected across the output of amplifier 30 and node 34. The combination of amplifier 30 and resistor 33 effectively transforms the current flowing through DUT 40 into a voltage which appears at the output of amplifier 30. The output of amplifier 30 is connected to the positive input of operational amplifier 31.

Amplifier 31 functions as a gain stage and has its negative input coupled to voltage reference $V_{REF2}$. The reference voltages $V_{REF1}$ and $V_{REF2}$ coupled to op amps 30 and 31, respectively, determine at what current level switching occurs. In other words, the reference voltages $V_{REF1}$ and $V_{REF2}$ establish the reference current at which point the voltage threshold is defined. The voltage $V_{REF1}$ sets the drain voltage on DUT 40, and $V_{REF2}$ sets the current limit. By way of example, for $V_{REF2} = 3$ volts, and a $V_{REF1} = 2.5$ volts reference current of 1 $\mu A$ is produced. This means that when the voltage at the output of amplifier 30 reaches 3 volts, the current flowing through resistor 33 is equal to 1 $\mu A$.

Note that one advantage of the sensor configuration comprising op amps 30 and 31 and resistor 33 is the fact that a constant voltage is maintained at the drain of DUT 40. This eliminates drain voltage fluctuations which would lead to slow settling times. It is further appreciated that the second operational amplifier 31 is optionally included in the embodiment of FIG. 4, and may be removed without detracting from the spirit or scope of the present invention. Preferably, amplifier 31 is included for the purpose of providing additional gain in the loop path. Thus, if op amp 30 satisfies the gain requirements of the circuit of FIG. 4, then amplifier 30 may be removed.

The output of gain amplifier 31 is coupled to what is basically the input of a high-gain CMOS inverter comprising devices 36 through 39. Field-effect devices 36 and 37 comprise ordinary p-channel MOSFETs, while devices 38 and 39 comprise ordinary n-channel MOSFETs. Devices 37 and 38 are coupled in a CMOS inverter-type configuration with the output of amplifier 31 being coupled to the input of the inverter (i.e., to the gates of devices 37 and 38). The output of the inverter is provided at node 43. Upper and lower p-channel and n-channel devices 36 and 39 are shown coupled in series with the CMOS inverter so as to control the current flowing through the inverter stage. That is, as current flows from the positive supply potential, $V_{CC}$, down to capacitor 42, or from capacitor 42 down to ground or $V_{SS}$, the magnitude is modulated by the conductivity in devices 36 and 39 while the direction of the current is modulated by the conductivity of devices 37 and 38. The conductivity in devices 36 and 39, in turn, is controlled by the voltages present on their gates. These gates are coupled to the current mirror, which collectively comprises transistors 50 through 54.

In the current mirror circuit of FIG. 4, transistor 52 controls the magnitude of the current flowing in each stage of the mirror. This current (i.e., $I_1$) is governed by the voltage, $V_{BIAS}$, present on the gate of transistor 52. As is well-known, the same current flowing through device 52 (e.g., $I_1$) also flows through devices 50, 51 and 53 (e.g., $I_2$). In other words, the current level established in transistor 52 is mirrored across to transistors 51 and 53 (e.g., $I_1 = I_2$), which in turn is also mirrored across to transistors 36 and 39.

With continuing reference to FIG. 4, resistor 59 and capacitor 56 generate an RC transient which is employed as an amplitude control means in the present invention. Following power-up or reset, resistor 59 and capacitor 56 create an RC transient which dynamically limits the currents $I_1$ and $I_2$ in the current mirrors. This has the effect of dynamically lowering the voltages present at the gates of transistors 36 and 39. In other words, these gate voltages will diminish over time. The net effect is that the current $I_3$ flowing in the inverter stage is exponentially decreased as a function of time. This means that the maximum voltage swing which can be realized at node 43 is limited to an envelope region which narrows over the course of time. This aspect of the present invention will be explained further in the next section.

The n-channel transistor 54 is shown having its drain coupled to resistor 59 and capacitor 56, its source coupled to ground, and its gate coupled to external reset pin. Thus configured, when the gate of transistor 54 is raised to a high positive potential capacitor 56 is discharged. Discharging of capacitor 56 (and also capacitor 42 through transistor 45) resets the circuit of FIG. 4. This permits testing of the next device in the array.

It is appreciated by practitioners in the art that by having node 43 coupled to the gate of DUT 40 in a feedback manner with amplifiers 30 and 31, that the voltage at node 43 will rapidly settle to the voltage threshold $V_T$ of device 40. That is, upon connection of the circuit of FIG. 4 to DUT 40, feedback amplifiers 30 and 31 will drive node 43 to the threshold voltage $V_T$ of DUT 40. This occurs in a manner which is similar to that described in connection with FIG. 3. However, unlike the circuit of FIG. 3, the voltage swing which is generated at node 43 is dynamically limited by the RC transient introduced into the control circuit by resistor 59 and capacitor 56. This means that the oscillations normally produced in the feedback loop, which includes the decoder circuitry, are dampened considerably at the end of the RC transient. This facilitates rapid settlement of the voltage on node 43 to the $V_T$ of DUT 40. Capacitor 42, in the currently preferred embodiment is coupled to node 43 and used to sink/source current from/to the output of the CMOS inverter stage comprising devices 36–39. Currently, a 10 picofarad capacitor is employed.

In actual practice, DUT 40 is coupled to the circuit of FIG. 4 through ordinary decoder circuitry associated with the integrated circuit which contains DUT 40. Once DUT 40 has been selected transistor 52 is activated by applying a high positive potential to the node labelled $V_{BIAS}$. At this time, and all throughout the measuring process, the reset pins in FIG. 4 remain low. The $V_{SOURCE}$ node 32 is either grounded or taken to an appropriate reference potential. Following application of the voltage $V_{BIAS}$ to the gate of transistor 52, currents $I_1$ and $I_2$ flow in the current mirror. Because of the feedback configuration, the voltage at node 43 begins oscillating. However, as a function of time the magnitude of currents $I_1$ and $I_2$ (and also $I_3$) begins to decay exponentially due to the RC transient generated by resistor 59 and capacitor 56. The exponential decay creates an envelope which limits the maximum voltage swing attainable at node 43. Thus, the voltage swing is increasingly limited as a function of time. This means that the oscillations at node 43 are decreasingly confined within the envelope. In other words, the oscillations are dampened with the dampening factor being a function of the resistance and capacitance values chosen. As a consequence, faster settling is achieved.

Using the resistance and capacitance values provided in FIG. 4, typical currents ($I_1$ and $I_2$) in the order of 10 to 100 microamperes are produced. This assures settling times which are typically in the order of approximately 5 microseconds. Obviously, these parameters are dependent on many factors, such as the nature of the decoders present on the feedback path, the layout of the array, the type of operational amplifiers utilized, individual device characteristics, etc. Thus, the resistance and capacitance values chosen for the currently preferred embodiment are optimized for a specific application. For different array using different devices, other resistance and capacitance values may be chosen. In each case, the values for resistor 59 and capacitors 56 and 42 are chosen in order to optimize the settling time of the loop. Optimization assures that the exponentially decaying envelope is tailored for the fastest settling time possible for the particular DUT measured.

Another component which is optionally included in the currently preferred embodiment of the present invention is operational amplifier 47. Amplifier 47, which is shown configured as a voltage follower, functions as a buffer between node 43 and the gate of DUT 40. Since node 43 will eventually be coupled to an external measurement device (such as a voltmeter) for recording the voltage threshold value of DUT 40, it is desirable to have a high conductance at the gate of DUT 40. The voltage follower configuration of amplifier 47 is ideally-suited for providing this high conductance.

Also coupled to node 43 is transistor 45 whose gate is coupled to a reset pin. The other terminal of transistor 45 is coupled to $V_{SOURCE}$ pin. The purpose of transistor 45 is to discharge capacitor 42 once $V_T$ measurement has been completed. Recall that transistor 54 is used for the same purpose; that is, for discharging capacitor 56. Once the $V_T$ value has been recorded for a particular device within the array, $V_{BIAS}$ is taken to a low potential (e.g., 0 volts) and the reset pin is taken high. This discharges capacitors 42 and 56, and prepares the circuit of FIG. 4 for the next device within the array. After the next device is coupled to the circuit of FIG. 4, reset pin is returned to low and $V_{BIAS}$ is again applied to the gate of device 52 as described above.

FIG. 5 illustrates a sample waveform produced during a typical measurement cycle. In FIG. 5, waveform 60 represents the voltage produced at node 43 of the present invention. Dashed line 63 represents the actual voltage threshold $V_T$ of DUT 40. Recall that upon application of the circuit of FIG. 4 to DUT 40, the voltage at node 43 begins to oscillate in a sinusoidal manner. During these oscillations, waveform 60 crosses the threshold of DUT 40 at various points 61. The limitation in the dynamic range of the feedback loop response is depicted by lines 62 in FIG. 5. Lines 62 show how the voltage swing at node 43 is confined as a function of time. The shape of envelope 62 is determined by resistor 59 and capacitor 56. This decaying envelope corresponds to the decaying currents $I_1$ and $I_2$. By dynamically limiting the response at node 43, waveform 60 is forced to converge more rapidly to the threshold voltage $V_T$ of DUT 40.

Whereas many alternations and modifications at the present invention will no doubt become apparent to a person of ordinary skill in the art after having read the foregoing description, it is to be understood that the particular embodiments shown and described by way of illustration are no way intended to be considered limiting. For example, use of an alternative circuit means for limiting the response within the feedback loop would be well within the spirit and scope of the present invention. Therefore, reference to the details of the preferred embodiments are not intended to limit the scope of the claims which themselves recite only those features regarded as essential to the invention.

I claim:

1. A circuit for determining the voltage threshold of a field-effect device having a pair of spaced-apart regions of a first conductivity type formed in a semiconductor substrate of a second conductivity type, and a gate controlling the conductivity between said spaced-apart regions, said circuit comprising:
    amplifier means for causing a current to flow through said device and for producing an output voltage directly proportional to said current;
    circuit means for receiving said output voltage and for generating a feedback voltage at said gate of said device, said feedback voltage being dynamically limited by an RC transient such that said feedback voltage rapidly settles to said voltage threshold of said device.

2. The circuit of claim 1 further comprising decoding means for coupling said spaced-apart regions to said amplifier means and also for coupling said gate to said circuit means.

3. The circuit of claim 2 further comprising measuring means for reading said feedback voltage generated at said gate.

4. The circuit of claim 3 further comprising reset means for resetting said circuit prior to the measurement of another device.

5. The circuit of claim 4 wherein said field-effect device comprises an n-channel metal-oxide-semiconductor (MOS) device.

6. The circuit of claim 5 further comprising a buffer means coupled between said circuit means and said gate for presenting a high output impedance to said gate.

7. The circuit of claim 6 wherein said amplifier means comprises an operational amplifier having an input coupled to one of said spaced-apart regions, an output and a feedback resistor coupled between said output and said input.

8. The circuit of claim 7 wherein said circuit means comprises:
    switching circuit means for producing said feedback voltage in response to said output voltage, the amplitude of said feedback voltage being dependent on the current flowing through said switching circuit means; and
    a current mirror including a resistor and a capacitor for developing said RC transient, said current mirror dynamically limiting said current flowing in said switching circuit means according to said RC transient.

9. A circuit for determining the voltage threshold of a field-effect semiconductor device having a source region, a drain region and a gate which controls the conductivity between said source and drain regions, said circuit comprising:
    a node;
    an operational amplifier means having one input coupled to said drain region and a resistive feedback element for producing a first output voltage proportional to the current flowing through said device;
    a feedback circuit means for producing a second output voltage at said node in response to said first output voltage, said second output voltage exhibiting correspondence with said first output voltage except that the amplitude of said second output voltage is dynamically limited by an output current which decays according to an RC transient such that when said node is coupled to said gate said second output voltage rapidly settles to said voltage threshold of said device;
    decoder circuit means for coupling said node to said gate;
    measuring means for reading said voltage threshold at said gate.

10. The circuit of claim 9 further comprising a buffer circuit means having a relatively high output impedance for buffering said second output voltage produced at said node from said decoder means.

11. The circuit of claim 10 further comprising capacitor means for alternatively sinking and sourcing current to said node during settling of said second output voltage.

12. The circuit of claim 11 wherein said buffer means comprises an operational amplifier configured as a voltage follower.

13. The circuit of claim 12 further comprising reset means for resetting said circuit prior to the measurement of another device.

14. The circuit of claim 13 wherein said feedback circuit means comprises a current mirror coupled to an inverter stage, said current mirror including a resistor and a capacitor for developing said RC transient, said inverter stage receiving said first output voltage and producing said second output voltage, said output current flowing through said inverter stage and being controlled by said current mirror.

15. The circuit of claim 14 wherein said reset means comprises a first and second field-effect transistors coupled across said capacitor means, said first and second field-effect transistors discharging said node and said capacitor means, respectively, upon the application of a predetermined potential to their gates.

16. The circuit of claim 15 wherein said device comprises an n-channel metal-oxide-semiconductor (MOS) transistor.

17. A circuit for determining the voltage threshold of an MOS device having a source region, a drain region and a gate, said circuit comprising:
an operational amplifier having one input coupled to said drain region and an output, said operational amplifier being configured to include a feedback resistor such that said output produces a first voltage which is directly proportional to the channel current flowing in said MOS device;
a switching circuit comprising first and second p-channel devices and first and second n-channel devices all coupled in series in that order, said output being coupled to the gates of said second p-channel and said first n-channel devices, said switching circuit generating a feedback voltage at a node coupled to the drains of said second p-channel and said first n-channel devices, said feedback voltage being dependent on the current flowing in said switching circuit with said current being controlled by the gate voltages on said first p-channel and said second n-channel devices;
a control circuit means for generating said gate voltages, said control circuit means including an RC network having an associated RC transient response which exponentially lowers said gate voltages, thereby lowering said current, when said node is coupled to said gate of said MOS device.

18. The circuit of claim 17 further comprising a capacitor coupled to said node for sinking/sourcing current to/from said node.

19. The circuit of claim 18 further comprising a voltage follower coupled in series between said node and said gate of said device, said voltage follower presenting a relatively high impedance at said gate such that said voltage threshold may be measured externally at said gate without disturbance to said circuit.

20. The circuit of claim 19 further comprising reset means for discharging said capacitor and said RC network prior to the measurement of a new MOS device.

21. The circuit of claim 20 wherein said MOS device comprises an n-channel device.

* * * * *